(12) United States Patent
Tamenori

(10) Patent No.: US 9,870,938 B2
(45) Date of Patent: Jan. 16, 2018

(54) SEMICONDUCTOR ELEMENT PRODUCING METHOD BY FLATTENING PROTECTIVE TAPE

(71) Applicant: FUJI ELECTRIC CO., LTD., Kawasaki-shi (JP)

(72) Inventor: Akira Tamenori, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 650 days.

(21) Appl. No.: 14/510,491

(22) Filed: Oct. 9, 2014

(65) Prior Publication Data

US 2015/0038057 A1 Feb. 5, 2015

Related U.S. Application Data

(63) Continuation of application No. PCT/JP2013/070519, filed on Jul. 29, 2013.

(30) Foreign Application Priority Data

Sep. 7, 2012 (JP) .................. 2012-197949

(51) Int. Cl.
*H01L 21/683* (2006.01)
*H01L 21/304* (2006.01)
(Continued)

(52) U.S. Cl.
CPC .......... *H01L 21/6836* (2013.01); *B32B 37/06* (2013.01); *B32B 37/1207* (2013.01);
(Continued)

(58) Field of Classification Search
None
See application file for complete search history.

(56) References Cited

U.S. PATENT DOCUMENTS 6,623,594 B1 9/2003 Yamamoto et al.
2004/0140516 A1* 7/2004 Yoshikawa ............... B32B 3/00
257/437
(Continued)

FOREIGN PATENT DOCUMENTS

JP 2000-038556 A 2/2000
JP 2005-317570 A 11/2005
(Continued)

OTHER PUBLICATIONS

Japanese Office Action with translation dated Nov. 10, 2015.

*Primary Examiner* — Michelle Mandala
(74) *Attorney, Agent, or Firm* — Rabin & Berdo, P.C.

(57) ABSTRACT

A semiconductor element producing method is disclosed. In the method, a surface protective tape including a base layer and an adhesive layer (including an intermediate layer) is attached to the front surface of a wafer that has unevenness caused by a polyimide passivation. The wafer is placed on a stage, with the surface protective tape facing the stage. The surface protective tape is heated while being drawn to the stage to flatten the surface of the surface protective tape. A grinding process is performed on the rear surface of the wafer to reduce the thickness of the wafer. A rear surface element structure is formed on the rear surface of the wafer, and the wafer is diced into chips.

5 Claims, 17 Drawing Sheets

(51) Int. Cl.
  *B32B 37/06* (2006.01)
  *B32B 37/12* (2006.01)
  *B32B 38/00* (2006.01)
  *B32B 38/18* (2006.01)
  *H01L 21/78* (2006.01)

(52) U.S. Cl.
  CPC ......... *B32B 38/0012* (2013.01); *B32B 38/18* (2013.01); *H01L 21/304* (2013.01); *H01L 21/6838* (2013.01); *H01L 21/78* (2013.01); *B32B 2037/1223* (2013.01); *B32B 2038/0016* (2013.01); *B32B 2038/0028* (2013.01); *B32B 2307/202* (2013.01); *B32B 2405/00* (2013.01); *B32B 2457/14* (2013.01); *H01L 2221/6834* (2013.01); *H01L 2221/68327* (2013.01); *H01L 2221/68386* (2013.01); *Y10T 156/1028* (2015.01)

(56) References Cited

U.S. PATENT DOCUMENTS

| | | | |
|---|---|---|---|
| 2005/0236107 A1* | 10/2005 | Doi | C09J 7/0246 156/710 |
| 2009/0073351 A1* | 3/2009 | Kakinuma | G02F 1/1334 349/89 |
| 2010/0038009 A1 | 2/2010 | Okuno et al. | |
| 2010/0255299 A1 | 10/2010 | Kawashima et al. | |

FOREIGN PATENT DOCUMENTS

| | | |
|---|---|---|
| JP | 2006-114598 A | 4/2006 |
| JP | 2006-196710 A | 7/2006 |
| JP | 2010-045189 A | 2/2010 |
| JP | 2010-258426 A | 11/2010 |
| JP | 2010-267746 A | 11/2010 |
| WO | WO-2009/081880 A1 | 7/2009 |

\* cited by examiner

A FEW MILLIMETERS TO 20 mm

A FEW MILLIMETERS TO 20 mm

US 9,870,938 B2

SEMICONDUCTOR ELEMENT PRODUCING METHOD BY FLATTENING PROTECTIVE TAPE

This non-provisional application is a continuation of and claims the benefit of priority of Applicant's earlier filed International Application No. PCT/JP2013/070519 filed Jul. 29, 2013, the entire contents of which are incorporated herein by reference.

TECHNICAL FIELD

The present invention relates to a semiconductor element producing method.

BACKGROUND ART

In the related art, an integrated circuit (IC) obtained by connecting a plurality of transistors or resistors so as to form an electrical circuit and integrating them into one chip has been generally used in a main portion of a computer or a communication apparatus. In addition, there is a power semiconductor element as a semiconductor element which is used to switch a higher voltage or a larger amount of current than the IC. Examples of the power semiconductor element include an insulated gate bipolar transistor (hereinafter, referred to as an IGBT) and a diode.

Here, an IGBT producing process according to the related art will be described. First, a surface element structure portion including a base region, an emitter region, a gate oxide film, a gate electrode, an interlayer insulating film, an emitter electrode, and an insulator passivation is formed on the front surface side of a wafer. The emitter electrode is, for example, an aluminum-silicon film. The insulator passivation is, for example, a polyimide film. Then, a polyimide passivation is formed on the front surface of the wafer.

Then, a surface protective tape is attached to the front surface of the wafer on which the polyimide passivation is formed and the rear surface of the wafer is ground such that the wafer has a desired thickness. Then, for example, a collector layer is formed on the rear surface of the wafer. Then, a plurality of metal materials, such as aluminum, titanium, nickel, and gold, are formed on the rear surface of the wafer, that is, the surface of the collector layer by vapor deposition to form a collector electrode. Finally, a dicing tape is attached to the collector electrode and the wafer is diced into a plurality of chips. In this way, the IGBT is completed.

In general, the surface protective tape which has been used in the related art is a combination of a base layer and an adhesive layer (including an intermediate layer) and has a thickness of, for example, 150 μm. In addition, as the surface protective tape, a hot-melt sheet has been known which includes at least a hot-melt layer with a melting point of 105° C. or less and is heated and stuck to the surface of a semiconductor wafer (for example, see the following Patent Document 1).

As a method of attaching the surface protective tape to the front surface of the wafer as described above, a method has been proposed which attaches a surface protective tape including a base layer and an adhesive layer to the surface of a semiconductor wafer which has unevenness caused by a polyimide passivation and heats the surface protective tape to deform the base layer and the adhesive layer, thereby substantially flattening the surface of the base layer (for example, see the following Patent Document 2).

As another method, the following method has been proposed. A protective tape is supplied onto the surface of a semiconductor wafer and is rolled and moved while being pressed by a sticking roller. The protective tape is attached to the surface of the semiconductor wafer. The attached protective tape is cut along the outer circumference of the semiconductor wafer. Then, a pressing member presses the upper surface of the protective tape to flatten the surface of the protective tape (for example, see the following Patent Document 3).

As another method, a method has been proposed which sticks a semiconductor wafer protective adhesive sheet obtained by sequentially laminating a base, at least one intermediate layer, and an adhesive layer to the surface of a semiconductor wafer. In the method, the adhesion temperature between the adhesive sheet and the semiconductor wafer is in the range of 50° C. to 100° C. and the loss tangent (tan δ) of the intermediate layer which comes into contact with the adhesive layer at the adhesion temperature is equal to or greater than 0.5 (for example, see the following Patent Document 4).

As another method, a method has been proposed which includes a heating step of heating a mounting means on which a workpiece is placed using a heating means, a drawing step of evacuating a pressure chamber, which accommodates the mounting means and the workpiece placed on the mounting means and can be hermetically sealed, using a drawing means, a sticking step of moving the workpiece close to a tape member and sticking the workpiece to the tape member after the chamber reaches a vacuum, and a pressurization step of operating a pressurization means to introduce air into the pressure chamber in a pressurized state after the sticking is performed for a predetermined period of time in the adhesion step (for example, see the following Patent Document 5).

CITATION LIST

Patent Document

Patent Document 1: JP 2000-038556 A
Patent Document 2: JP 2005-317570 A
Patent Document 3: JP 2010-045189 A
Patent Document 4: JP 2010-258426 A
Patent Document 5: JP 2006-114598 A

DISCLOSURE OF THE INVENTION

Problem to be Solved by the Invention

However, when the polyimide passivation is formed on the front surface of the wafer before the rear surface of the wafer is ground as in the above-mentioned production process, the following various defects occur. FIG. 21 is a cross-sectional view schematically illustrating the attached state of the surface protective tape according to the related art to the front surface of the wafer. For example, a polyimide passivation 102 for protecting a surface element structure portion is formed along the outer periphery of each chip so as to surround an element forming region of each of a plurality of chips produced in a wafer 101.

That is, as illustrated in FIG. 21, the polyimide passivation 102 is formed on the front surface of the wafer 101. The polyimide passivation 102 is formed in a convex shape on the front surface of the wafer 101. The polyimide passivation 102 is provided along a dicing line in the regions which are partitioned in a lattice shape by the dicing lines. Since a portion with a convex shape (hereinafter, referred to as a convex portion) caused by the polyimide passivation 102 and a concave portion surrounded by the convex portion are formed, a plurality of uneven portions are formed on the front surface of the wafer 101. A level difference caused by the uneven portions is in the range of about 10 µm to 20 µm and the concave portion has a size of a few millimeters square to 20 mm square. A surface protective tape 103 according to the related art has a small thickness of about 150 µm and has only the performance of reducing a level difference of about a few micrometers.

Therefore, even when the surface protective tape 103 according to the related art is attached to the front surface of the wafer 101, it attached along the uneven portions caused by the polyimide passivation 102 and about 95% of the level difference caused by the polyimide passivation 102 on the front surface of the wafer 101 remains on the front surface of the wafer 101. Therefore, while the rear surface of the wafer 101 is being ground, the surface element structure portion (mainly the aluminum-silicon film forming the emitter electrode), which is formed in the concave portion surrounded by the lattice-shaped convex portion caused by the polyimide passivation 102 on the front surface of the wafer 101, is pressed by an abrasive wheel from the rear surface of the wafer 101 and is deformed. In this state, the grinding process is performed.

Therefore, when the unevenness caused by the polyimide passivation 102 is large, large stress is applied to the concave portion in the front surface of the wafer 101 and the wafer 101 is likely to be damaged only by the grinding process on the rear surface of the wafer 101. Even if the wafer 101 is not damaged, the rear surface of the wafer 101 is ground, with stress being applied to the concave portion in the front surface of the wafer 101. As a result, the thickness of a portion of the wafer 101 in which the concave portion is provided is more than the thickness of a portion of the wafer 101 in which the convex portion is provided by the polyimide passivation 102.

For example, the polyimide passivation 102 is formed with a width of about 100 µm to 500 µm along the outer periphery of each of the rectangular chips which are partitioned by the dicing lines. In this case, when the rear surface of the wafer 101 is ground until the thickness of a portion of the wafer 101 in which the convex portion is provided by the polyimide passivation 102 is 100 µm, the thickness of a portion of the wafer 101 in which the concave portion that is surrounded by the convex portion caused by the polyimide passivation 102 is provided, that is, the thickness of a central portion of the chip is about 110 µm. In this case, the breakdown voltage of the chip which is designed at a wafer thickness of 100 µm is obtained, but electrical loss corresponding to the thickness, 110 µm, of the central portion of the wafer 101 occurs. On the contrary, when the rear surface of the wafer 101 is ground until the thickness of a portion of the wafer 101 in which the concave portion is provided is 100 µm, the thickness of the outer periphery of the chip, which has a convex shape due to the polyimide passivation 102, is too small and there is a concern that breakdown will occur in the element when power is turned on.

As a method for solving these problems, the following method has been proposed. However, the method has many technical problems. For example, a method has been proposed which sticks a high-rigidity substrate to a wafer using, for example, an adhesive or a thick double-sided tape. However, for example, the following cost problems occur: a high material cost is required to reuse the high-rigidity substrate; and a large number of peripheral devices are required to stick the high-rigidity substrate to the wafer. In addition, an adhesion technique for improving the thickness accuracy of the wafer when the rear surface of the wafer is ground is required.

In addition, various types of tapes (mainly, a protective tape for unevenness caused by a solder bump) have been developed in which an uneven portion of the front surface of the wafer is filled with a thick surface protective tape to improve the performance of reducing the unevenness of the front surface of the wafer. However, since the tape has a large thickness of about 500 µm, it is possible to fill the unevenness caused by the scattered convex portions, such as solder bumps, but the performance of filling largely uneven portions which are provided in a lattice shape on the outer peripheral line of the chip is not high. Therefore, the thickness accuracy of the wafer after the rear surface of the wafer is ground is significantly reduced.

A method has been proposed which narrows a concave portion surrounded by a lattice-shaped convex portion caused by a polyimide passivation to remove unevenness caused by the polyimide passivation on the front surface of the wafer. However, excessive stress is applied to the wafer due to the polyimide passivation. Therefore, when the wafer is thinned, the warping of the wafer is too large and it is difficult to carry the wafer. Since the exposure area of the emitter electrode is small, there are restrictions in the assembly of the device. In addition, since the exposure area of the emitter electrode is small, the substantial bonding area between a wiring line which is formed by plating and the emitter electrode is small and a radiation performance deteriorates.

The hot-melt sheet disclosed in the above-mentioned Patent Document 1 follows the unevenness of the front surface of the wafer well and the wafer and a protection and holding sheet are stuck to each other without a gap therebetween. Therefore, the hot-melt sheet is used to prevent, for example, the infiltration of grinding water or foreign materials into a wafer pattern surface, a processing error, the occurrence of dimples, and the breaking of the wafer.

The above-mentioned Patent Document 1 discloses the example in which the hot-melt sheet is attached to the wafer which is dotted with bumps, but does not disclose a technique for reducing a level difference caused by an uneven portion, which includes a convex portion caused by the polyimide passivation provided along the dicing line and a concave portion with a size of about a few millimeters square to 20 mm square, in the regions that are partitioned in a lattice shape by the dicing lines. Therefore, even when the hot-melt sheet disclosed in the above-mentioned Patent Document 1 is attached to the front surface of the wafer having the large concave portion and the high convex portion, it is unclear whether a flat sheet surface is obtained.

The above-mentioned Patent Document 2 discloses the example in which a special thick surface protective tape with a thickness of 200 µm or more is attached to the front surface of the wafer and is heated in the furnace to reduce the unevenness caused by the polyimide passivation. However, in the above-mentioned Patent Document 2, the performance of reducing the unevenness caused by the polyimide passivation is not enough and there is a concern that the flatness of the wafer will be reduced. FIGS. 22 to 24 are cross-sectional views schematically illustrating another example in which the surface protective tape according to the related art is attached to the front surface of the wafer. FIGS. 22 and 23 correspond to FIGS. 11 and 1 in the above-mentioned Patent Document 2.

Specifically, as illustrated in FIG. 22, in a state in which a surface protective tape 113 is attached to the front surface of a wafer 101 in which unevenness is caused by a polyimide passivation 102, the surface protective tape 113 has a corrugated shape corresponding to the unevenness caused by the polyimide passivation 102 and it is difficult to sufficiently absorb the unevenness caused by the polyimide passivation 102. In this case, the unevenness of the surface protective tape 113 is equal to or greater than 80% of the unevenness caused by the polyimide passivation 102. In FIG. 22, reference numerals 114 and 115 indicate an adhesive layer (including an intermediate layer) and a base layer of the surface protective tape 113 (which holds for FIGS. 23 and 24).

Then, as illustrated in FIG. 23, even when the surface protective tape 113 is heated in the furnace to reduce the unevenness caused by the polyimide passivation 102, the unevenness of the surface protective tape 113 is reduced only to about 40% to 60% of the unevenness caused by the polyimide passivation 102. In this state, when the rear surface of the wafer 101 is ground, the unevenness has an adverse effect on the grinding accuracy of the wafer 101 and unevenness corresponding to the unevenness of the surface protective tape 113 occurs in the rear surface of the wafer 101, as illustrated in FIG. 24. As a result, the thickness accuracy of the chip is reduced.

In the method of pressing and heating the surface protective tape attached to the front surface of the wafer to flatten the surface of the surface protective tape as in the above-mentioned Patent Document 3 to Patent Document 5, the method has the performance of reducing the height of a plurality of convex portions caused by the surface element structure portion of the surface device, but it is difficult to exhibit the sufficient performance of reducing the height of the lattice-shaped convex portion caused by the polyimide passivation. Therefore, in the above-mentioned Patent Document 3 to Patent Document 5, when the rear surface of the wafer is ground, unevenness corresponding to the unevenness of the surface protective tape occurs in the rear surface of the wafer 101. As a result, the thickness accuracy of the chip is reduced.

The invention has been made in order to solve the above-mentioned problems of the related art and an object of the invention is to provide a semiconductor element producing method which attaches a surface protective tape for back grinding to the front surface of a wafer and reduces unevenness in the front surface of the wafer to improve the thickness accuracy of the wafer, when grinding the rear surface of the wafer which has the unevenness caused by a polyimide passivation on the front surface device side to produce a thin semiconductor element such as an IGBT.

Means for Solving Problem

In order to solve the above-mentioned problems and achieve the object, a semiconductor element producing method according to an aspect of the invention has the following characteristics. First, an attachment step of attaching a tape including a base layer and an adhesive layer to a front surface of a semiconductor wafer which has an uneven portion such that the adhesive layer comes into contact with the front surface of the semiconductor wafer is performed. Then, a drawing and heating step of heating the tape having a corrugated shape corresponding to the uneven portion of the semiconductor wafer while drawing the tape in a direction in which the tape is separated from the front surface of the semiconductor wafer to deform the adhesive layer, thereby substantially flattening a surface of the corrugated base layer, is performed.

In the semiconductor element producing method according to the above-mentioned aspect of the invention, a lattice-shaped convex portion may be provided on the front surface of the semiconductor wafer along outer periphery of each chip, which will be divided from the semiconductor wafer, such that an element forming region of each chip is a concave portion. In the drawing and heating step, the adhesive layer may be deformed so as to absorb a level difference between the lattice-shaped convex portion and the concave portion of the element forming region.

The semiconductor element producing method according to the above-mentioned aspect may further include a thinning step of grinding a rear surface of the semiconductor wafer, with the tape attached to the semiconductor wafer, to thin the semiconductor wafer after the drawing and heating step.

In the semiconductor element producing method according to the above-mentioned aspect of the invention, the thickness of an intermediate layer of the adhesive layer may be equal to or greater than 100 μm and equal to or less than 300.

According to the invention, the tape for back grinding which is attached to the front surface of the wafer (semiconductor wafer) is heated while being drawn in the direction in which the tape is separated from the front surface of the wafer. Then, extra air which remains between the adhesive layer of the tape and the front surface of the wafer when the tape is attached to the front surface of the wafer is broken into small air bubbles and the small air bubbles are generated in the concave portion in the front surface of the waver. The adhesive layer is deformed by the air bubbles and fills the concave portion in the front surface of the wafer. Therefore, the unevenness of the front surface of the wafer is reduced and it is possible to flatten the surface of the tape, as compared to the related art. As a result, it is possible to reduce a variation in the thickness of the wafer after the rear surface of the wafer is ground.

Effect of the Invention

According to the semiconductor element producing method of the invention, it is possible to reduce the surface unevenness of a surface protective tape for back grinding which is attached to the front surface of a wafer and improve the thickness accuracy of the wafer, when grinding the rear surface of the wafer which has unevenness caused by a polyimide passivation on the front surface device side to produce a thin semiconductor element such as an IGBT.

MODE(S) FOR CARRYING OUT THE INVENTION

Figure 1:
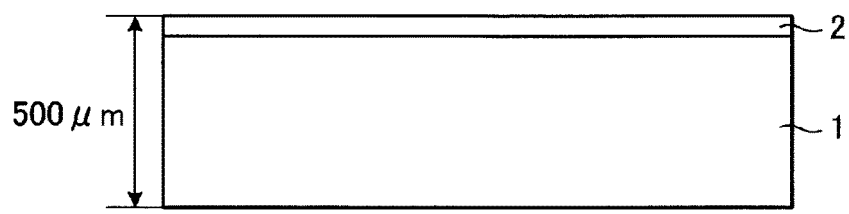
FIG. 1 is a cross-sectional view illustrating a semiconductor element producing method according to an embodiment of the invention.

Hereinafter, a preferred embodiment of a semiconductor element producing method according to the invention will be described in detail with reference to the accompanying drawings. In the following description of the embodiments and the accompanying drawings, the same components are denoted by the same reference numerals and the description thereof will not be repeated.

Embodiment

FIGS. 1 to 8 are cross-sectional views illustrating a semiconductor element producing method according to an embodiment of the invention. The semiconductor element to be produced is not particularly limited. In this embodiment, an example in which an n-channel IGBT with a field stop (FS) structure is produced (manufactured) using an n-type wafer (semiconductor wafer) will be described. It is assumed that a surface of a wafer on which a surface element structure portion is formed is referred to as a front surface of the wafer and a surface opposite to the front surface is referred to as a rear surface of the wafer. In FIGS. 1 to 8, the detailed structure of the surface element structure portion is not illustrated.

An example of a process for producing the front surface of a wafer 1 will be described. First, a gate oxide film, such as a $SiO_2$ film, and a gate electrode made of, for example, polysilicon are formed on the front surface of the wafer 1 and are then processed. Then, an interlayer insulating film, such as BPSG, is formed on the surfaces of the gate oxide film and the gate electrode and is then processed to form an insulated gate structure. Then, a $p^+$ base layer is selectively formed in a surface layer of the front surface of the wafer 1 and an $n^+$ emitter layer is selectively formed in the $p^+$ base layer.

Then, a surface electrode, that is, an emitter electrode which is, for example, an aluminum-silicon film is formed so as to come into contact with the $p^+$ base layer and the $n^+$ emitter layer. Then, an insulator passivation which is made of, for example, polyimide is formed on a portion which is provided along lattice-shaped dicing lines in a region surrounded by the dicing lines, that is, an outer peripheral portion of a region which will be a semiconductor chip. In this way, a surface element structure portion 2 is formed on the front surface of the wafer 1 (FIG. 1). In this case, the overall thickness of the wafer 1 including the surface element structure portion 2 is, for example, 500 µm. In FIG. 1, a level difference between the insulator passivation and the emitter electrode is not illustrated.

Figure 9:
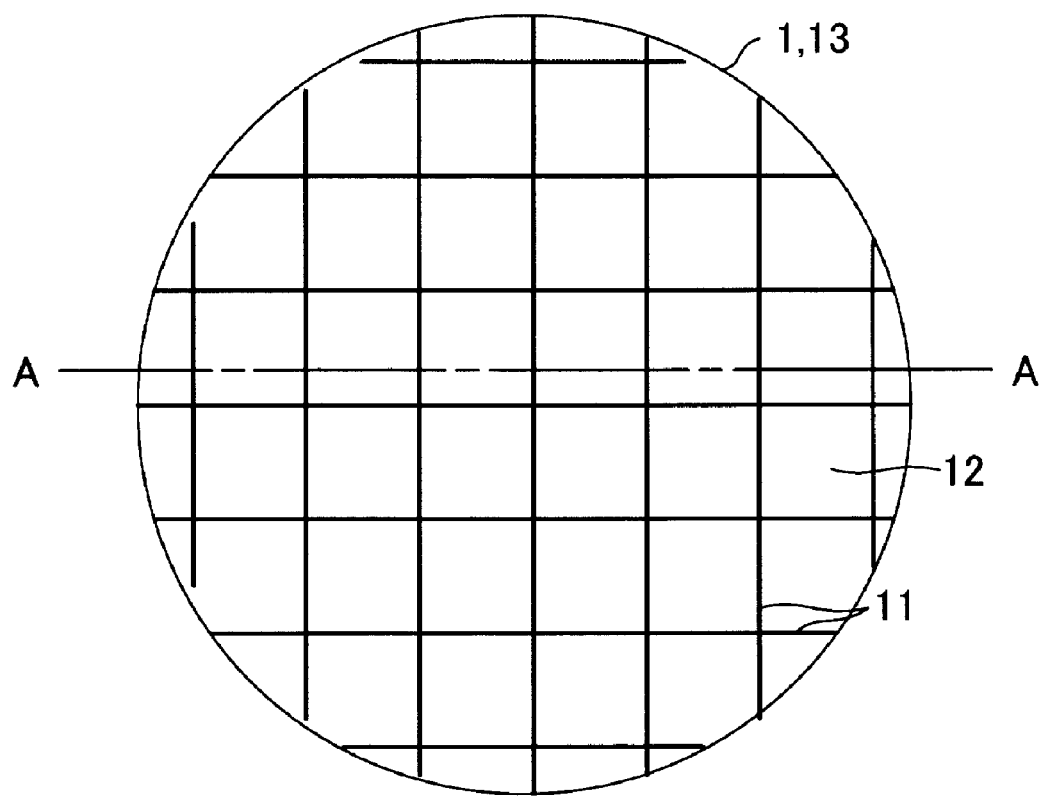
FIG. 9 is a plan view schematically illustrating an aspect in which a polyimide passivation is formed on the front surface of a wafer.
Figure 10:
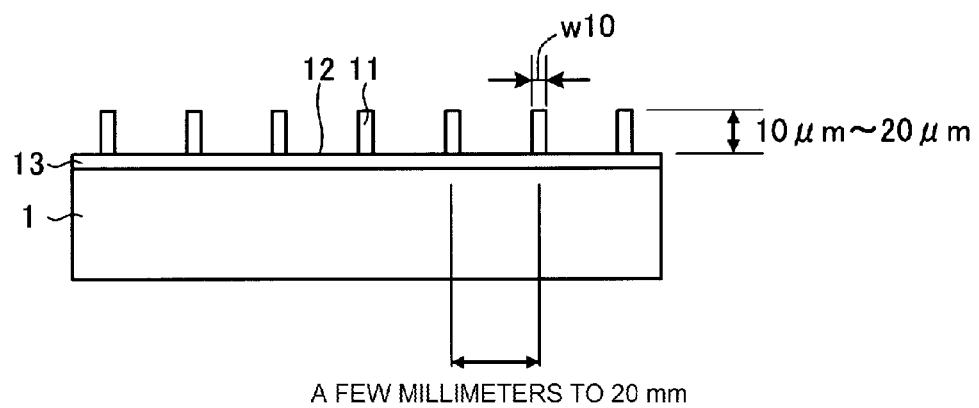
FIG. 10 is a cross-sectional view schematically illustrating the structure taken along the cutting line A-A of FIG. 9.

FIGS. 9 and 10 schematically illustrate an aspect in which the polyimide passivation is formed on the front surface of the wafer 1. FIG. 9 is a plan view schematically illustrating the aspect in which the polyimide passivation is formed on the front surface of the wafer. FIG. 10 is a cross-sectional view schematically illustrating the structure taken along the cutting line A-A of FIG. 9. In FIG. 9, a lattice-shaped thick solid line in the wafer 1 is a polyimide passivation 11 and a plurality of rectangular regions surrounded by the polyimide passivation 11 which extends in the vertical and horizontal directions are element forming regions 12 of each chip.

Figure 25:
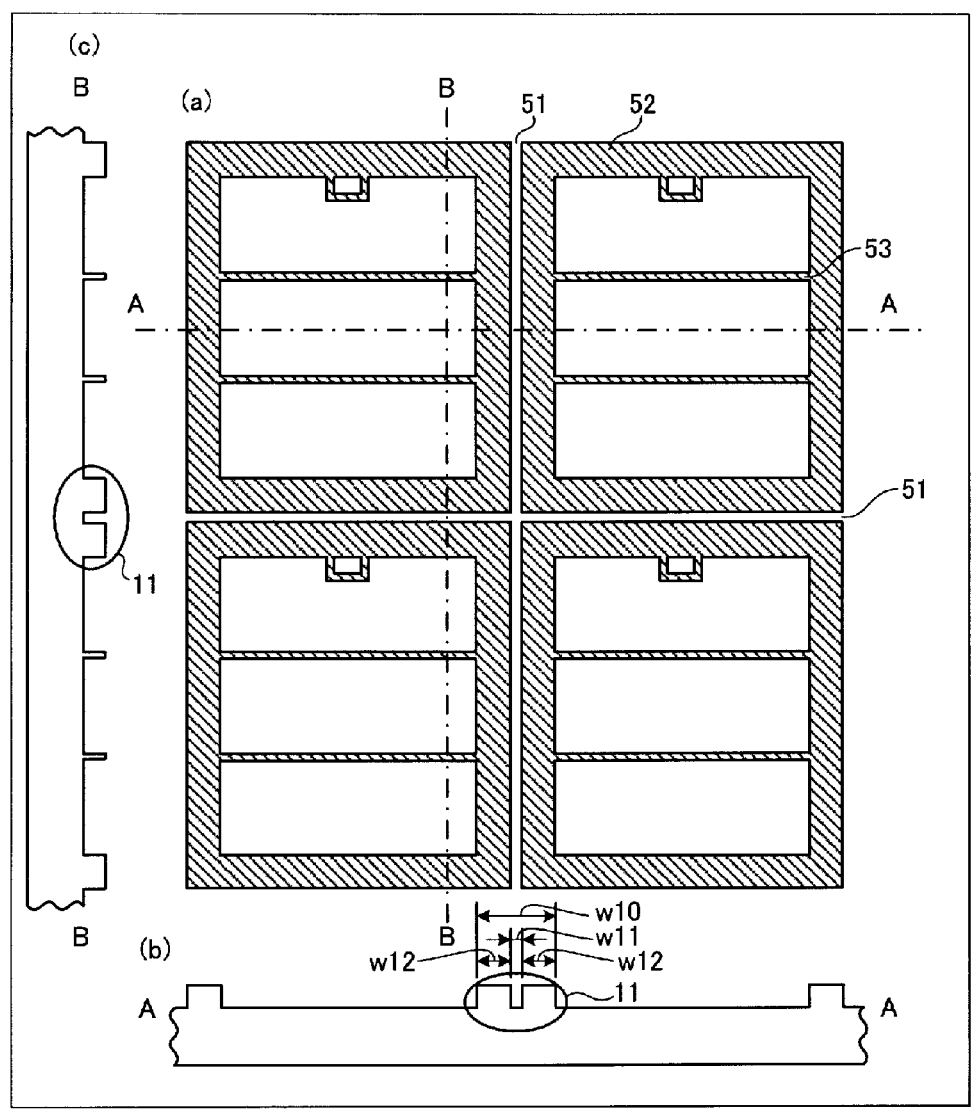
FIG. 25 is an enlarged plan view illustrating a portion of the front surface of the wafer illustrated in FIG. 9.

FIG. 25 illustrates an example of an aspect in which the vicinity of the element forming region 12 of the chip is enlarged. FIG. 25 is an enlarged plan view illustrating a portion of the front surface of the wafer illustrated in FIG. 9. As illustrated in FIG. 25(a), the element forming region of each chip is divided by dicing lines 51 and a polyimide passivation 52 is formed in an outer peripheral portion of the element forming region of the chip. When a gate runner is formed in the element forming region of the chip, in some cases, an insulator passivation 53 which is made of, for example, polyimide is formed on the gate runner.

FIGS. 25(b) and 25(c) are cross-sectional views schematically illustrating the structure taken along the cutting lines A-A and B-B of FIG. 25(a), respectively. As illustrated in FIG. 25, in this example, the polyimide passivation is not formed on the dicing line 51. The width w11 of the dicing line 51 is, for example, about 80 µm and the polyimide passivations 52 are formed so as to be adjacent to each other, with the dicing line 51 interposed therebetween. The polyimide passivations 11 illustrated in FIG. 10 are schematically illustrated as the polyimide passivations 52 which are formed adjacent to each other in FIGS. 25(b) and 25(c). In FIG. 10, the insulator passivation 53 formed on the gate runner is not illustrated.

As the breakdown voltage of the element increases, the width w12 of the polyimide passivation 52 increases. For example, the width w12 of the polyimide passivation 52 is, for example, about 600 µm at a breakdown voltage of 1200 V. For example, the width w12 of the polyimide passivation 52 is about 100 µm at a low breakdown voltage of 600 V or less, is about 300 µm at a breakdown voltage of 600 V, and is about 1300 µm in a reverse blocking (RB) device with a breakdown voltage of 1200 V. When the polyimide passivations 52 which are adjacent to each other with the dicing line 51 interposed therebetween re regarded as one convex portion, the width w10 of the convex portion (that is, the width w10 of a convex portion caused by the polyimide passivation 11 illustrated in FIG. 10) is about two times more than the width w12 of the polyimide passivation 52 and is, for example, about 1200 µm at a breakdown voltage of 1200 V.

As illustrated in FIG. 10, the size of each element forming region 12 is, for example, in the range of about a few millimeters square to 20 mm square. In addition, the height of the polyimide passivation 11 from an aluminum-silicon film 13 on the front surface of the wafer 1 is, for example, in the range of about 10 µm to 20 µm. That is, the element forming regions 12 are a plurality of concave portions which are surrounded by the lattice-shaped convex portion caused by the polyimide passivation 11. An uneven portion which includes the lattice-shaped convex portion caused by the polyimide passivation 11 and the plurality of concave portions surrounded by the convex portion is formed on the front surface of the wafer 1.

Figure 2:
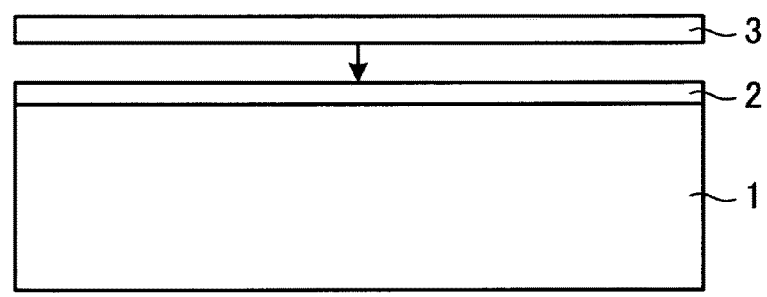
FIG. 2 is a cross-sectional view illustrating the semiconductor element producing method according to the embodiment of the invention.

After the surface element structure portion 2 is completed, a surface protective tape 3 for protecting the surface element structure portion 2 during back grinding is attached to the surface of the surface element structure portion 2 by, for example, a general tape sticking device, as illustrated in FIG. 2. The surface protective tape 3 includes a base layer that is made of a hard resin material, such as polyethylene terephthalate (PET), and an adhesive layer (including an intermediate layer) that adheres to the front surface of the wafer 1.

Figure 11:
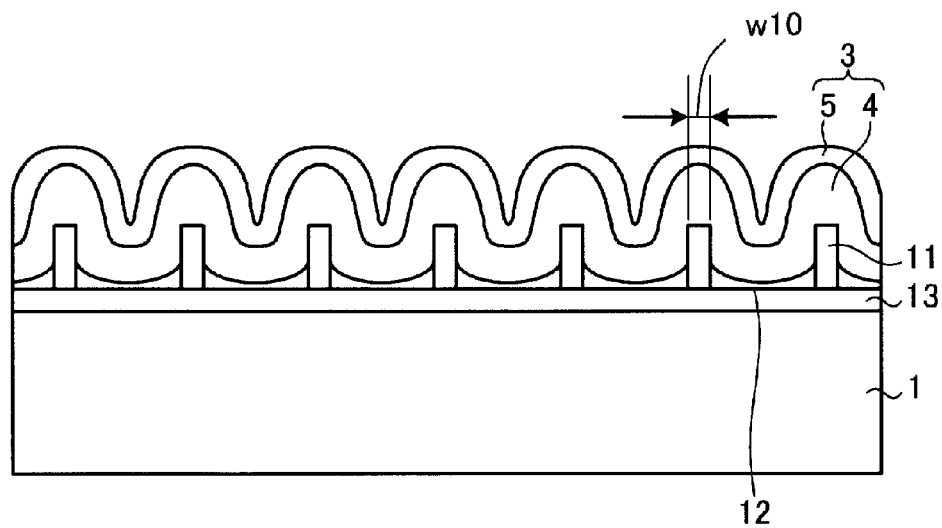
FIG. 11 is a cross-sectional view schematically illustrating the attached state of a surface protective tape to the front surface of the wafer.

FIG. 11 is a cross-sectional view schematically illustrating the attached state of the surface protective tape to the front surface of the wafer. As illustrated in FIG. 11, when the width w10 of the convex portion caused by the polyimide passivation 11 is large, only the attachment of the surface protective tape 3 is not sufficient to absorb the unevenness. Therefore, the surface of the surface protective tape 3 has a corrugated shape corresponding to the uneven portion caused by the polyimide passivation 11. The degree of unevenness of the surface of the surface protective tape 3 increases as the width w10 of the convex portion caused by the polyimide passivation 11 increases. In addition, reference numerals 4 and 5 denote the adhesive layer (including the intermediate layer) and the base layer of the surface protective tape 3, respectively. The adhesive layer 4 includes an adhesive layer which adheres to the wafer and the intermediate layer which is provided between the base layer 5 and the adhesive layer. The intermediate layer is made of a material which is expanded by heat. When the intermediate layer is heated, it has fluidity.

Figure 12:
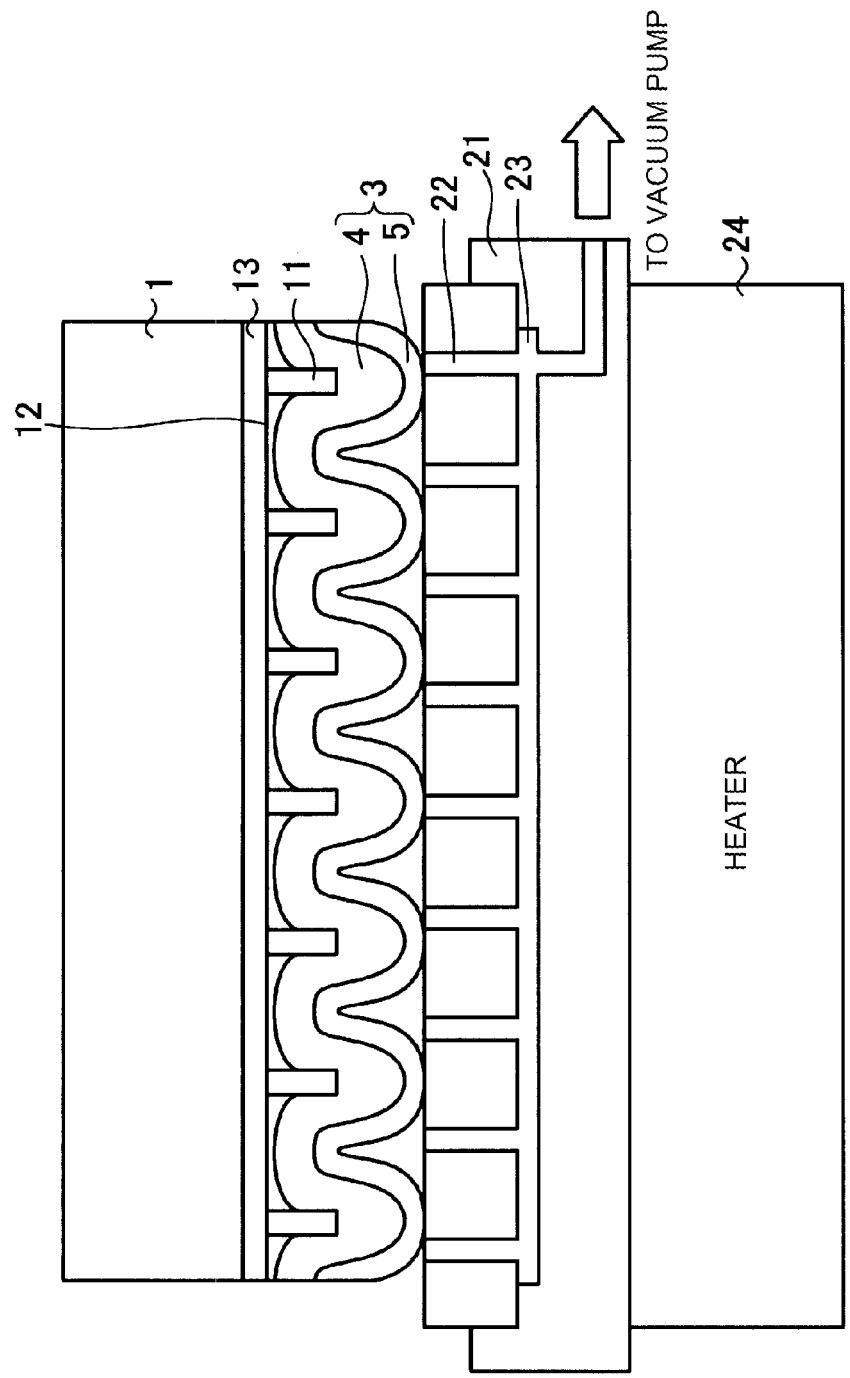
FIG. 12 is a cross-sectional view schematically illustrating an aspect when the surface protective tape attached to the front surface of the wafer starts to be drawn and heated.
Figure 13:
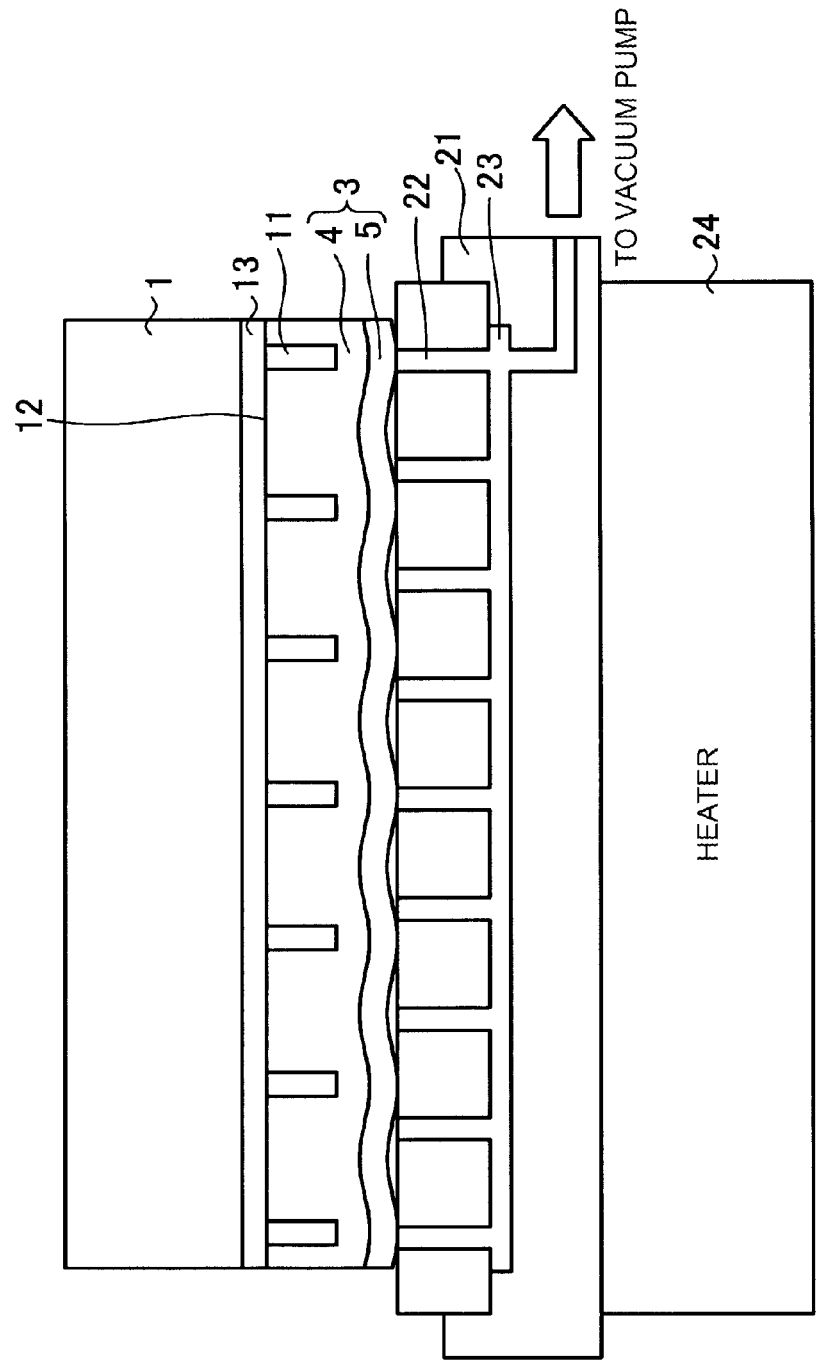
FIG. 13 is a cross-sectional view schematically illustrating an aspect after the surface protective tape attached to the front surface of the wafer is drawn and heated.

The surface protective tape 3 which has the corrugated shape corresponding to the unevenness of the semiconductor wafer is heated while being drawn in the direction in which it is separated from the front surface of the wafer 1. FIG. 12 is a cross-sectional view schematically an aspect when the surface protective tape attached to the front surface of the wafer starts to be drawn and heated. FIG. 13 is a cross-sectional view schematically an aspect after the surface protective tape attached to the front surface of the wafer is drawn and heated. As illustrated in FIG. 12, a plurality of vent holes 22 for vacuum suction are provided at predetermined intervals in a surface (hereinafter, referred to as an upper surface), on which the wafer 1 is placed, of a flat stage 21 on which the wafer 1 is placed. All of the vent holes 22 are connected to a pipe 23 provided in the stage 21 and are then connected to a drawing means (not illustrated), such as a vacuum pump (vacuum device) through valves (not illustrated). The drawing means performs vacuum suction to draw air from the upper surface of the stage 21. The stage 21 includes a heating means 24 such as a heater which heats the stage 21.

The wafer 1 is placed on the stage 21, with the surface protective tape 3 facing the stage 21. Since the surface protective tape 3 has a corrugated shape corresponding to the uneven portion caused by the polyimide passivation 11, a portion of the surface protective tape 3 which protrudes in correspondence with the convex portion caused by the polyimide passivation 11 comes into contact with the stage 21. In this state, the drawing means performs vacuum suction to draw the surface protective tape 3 to the stage 21 through the vent holes 22 and the pipe 23. At the same time as the surface protective tape 3 is drawn to the stage 21, the surface protective tape 3 is heated by the stage 21 which is heated by the heating means 24.

Since the surface protective tape 3 is heated while being drawn to the stage 21, there is a concern that a portion of the surface protective tape 3 which comes into contact with the vent hole 22 will be drawn into the vent holes 22 and deformed in a convex shape. In order to solve the problem, for example, the following measures can be taken: the opening width of the vent hole 22 is reduced; the stage 21 having a porous chuck is used; and force to draw the surface protective tape 3 is reduced.

When the surface protective tape 3 is heated, the intermediate layer of the adhesive layer 4 has fluidity. Therefore, as such, when the surface protective tape 3 is heated while being drawn to the stage 21, an air bubble between the adhesive layer 4 of the surface protective tape 3 before heating and the uneven portion of the front surface of the wafer 1 is broken into a plurality of small air bubbles. The small air bubbles are generated in the intermediate layer of the surface protective tape 3 and are then uniformly dispersed in the element forming region 12. As a result, the concave portion of the front surface of the wafer 1 is filled with the surface protective tape 3. Therefore, as illustrated in FIG. 13, the surface unevenness of the base layer 5 of the surface protective tape 3 is gradually reduced. Finally, the height of the uneven portion is equal to or less than 20% of the height of the uneven portion of the front surface of the wafer 1. That is, since the intermediate layer of the adhesive layer 4 has fluidity, a plurality of small air bubbles are dispersedly generated in the intermediate layer. As a result, the surface protective tape 3 is flattened.

Figure 3:
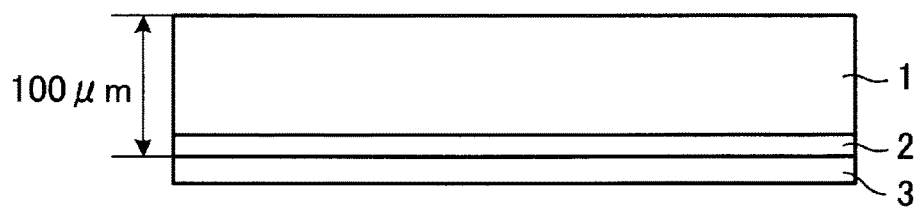
FIG. 3 is a cross-sectional view illustrating the semiconductor element producing method according to the embodiment of the invention.
Figure 14:
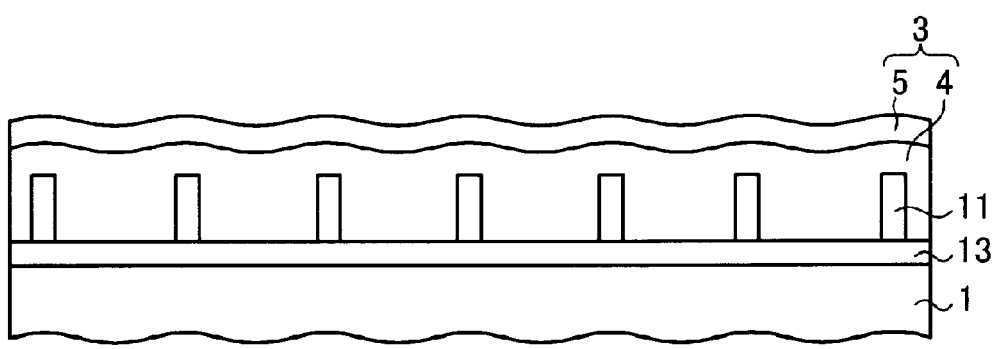
FIG. 14 is a cross-sectional view schematically illustrating a state after the rear surface of the wafer is ground.

After the surface of the surface protective tape 3 is flattened in this way, the wafer 1 is reversed and the rear surface of the wafer 1 is ground by a back grinding device such that the overall thickness of the wafer 1 including the surface element structure portion 2 is reduced to a desired thickness of, for example, 100 μm, as illustrated in FIG. 3. FIG. 14 is a cross-sectional view schematically illustrating the ground rear surface of the wafer. When the height of the uneven portion formed by the polyimide passivation 11 is, for example, 10 μm, the surface protective tape 3 is heated while being drawn, as described above, so that the height of the uneven portion of the surface of the surface protective tape 3 is reduced to about 2 μm or less (=10 μm×20% or less) in the surface of the element forming region 12 (the surface of the chip). As a result, as illustrated in FIG. 14, it is possible to reduce the height of the uneven portion, which is reflected in the rear surface of the wafer 1 when the rear surface of the wafer 1 is ground, to about 2 μm or less and thus to reduce a variation in the thickness of silicon in the surface of the chip to about 2 μm or less which is less than that in the related art. Therefore, it is possible to improve the thickness accuracy of the chip.

Figure 4:
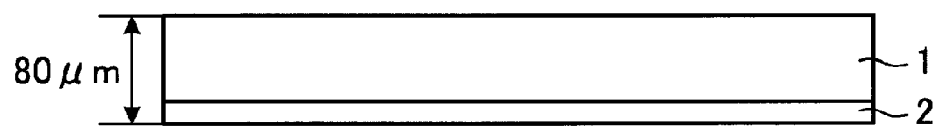
FIG. 4 is a cross-sectional view illustrating the semiconductor element producing method according to the embodiment of the invention.

After the wafer 1 is ground, the surface protective tape 3 is detached from the surface of the surface element structure portion 2 by, for example, a general tape peeling device, as FIG. 4. In this way, the surface protective tape 3 is removed. Then, spin etching or dip etching is performed on the ground surface of the wafer 1 to remove a fractured layer on the ground surface. In this way, the overall thickness of the wafer 1 including the surface element structure portion 2 is, for example, 80 μm.

Figure 5:
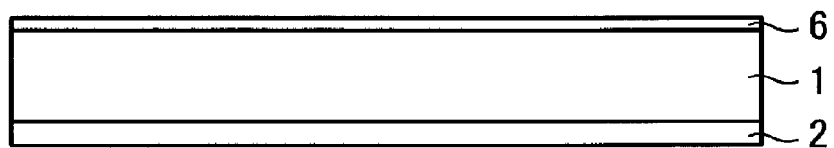
FIG. 5 is a cross-sectional view illustrating the semiconductor element producing method according to the embodiment of the invention.
Figure 6:
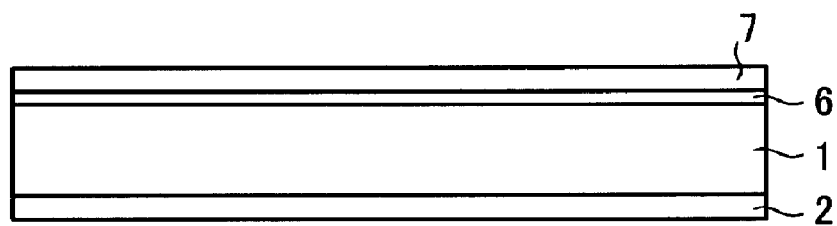
FIG. 6 is a cross-sectional view illustrating the semiconductor element producing method according to the embodiment of the invention.

Then, as illustrated in FIG. 5, for example, boron ions, which are p-type impurity ions, are implanted into the rear surface of the wafer 1. Then, for example, annealing using laser irradiation is performed on the rear surface of the wafer 1 to form a $p^+$ layer 6 which will be a collector layer. Then, as illustrated in FIG. 6, a plurality of metal materials, such as aluminum, titanium, nickel, and gold, are deposited on the rear surface of the wafer 1 to form a rear surface electrode 7 which will be a collector electrode.

Figure 7:
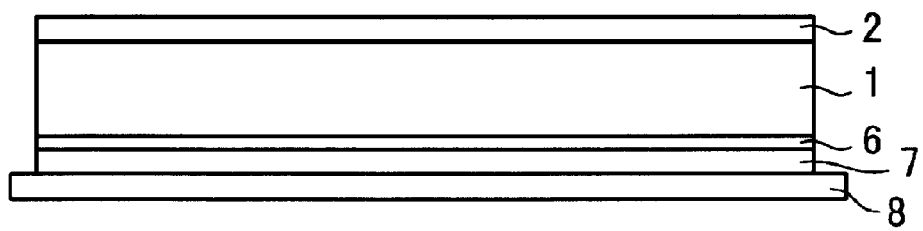
FIG. 7 is a cross-sectional view illustrating the semiconductor element producing method according to the embodiment of the invention.
Figure 8:
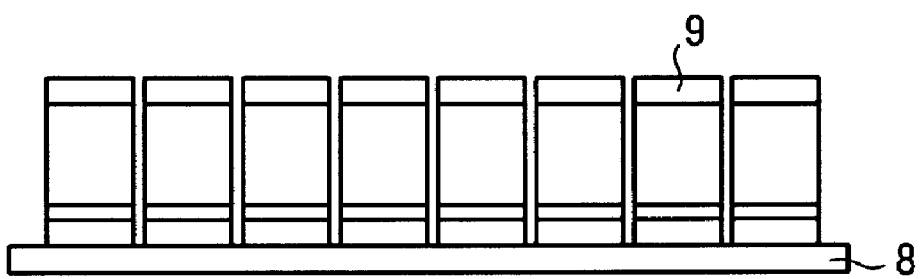
FIG. 8 is a cross-sectional view illustrating the semiconductor element producing method according to the embodiment of the invention.

Then, as illustrated in FIG. 7, a general dicing tape 8 is attached to the rear surface of the wafer 1 and the wafer 1 is reversed. Then, as illustrated in FIG. 8, the wafer 1 is divided into a plurality of chips 9. In this way, the semiconductor element according to the embodiment is completed. Although not illustrated in the drawings, each chip 9 is soldered to a fixed member, such as a wiring substrate, through the rear surface electrode 7. Then, an aluminum wire electrode is fixed to the electrode on the front surface of each chip 9 by an ultrasonic wire bonding device.

Figure 15:
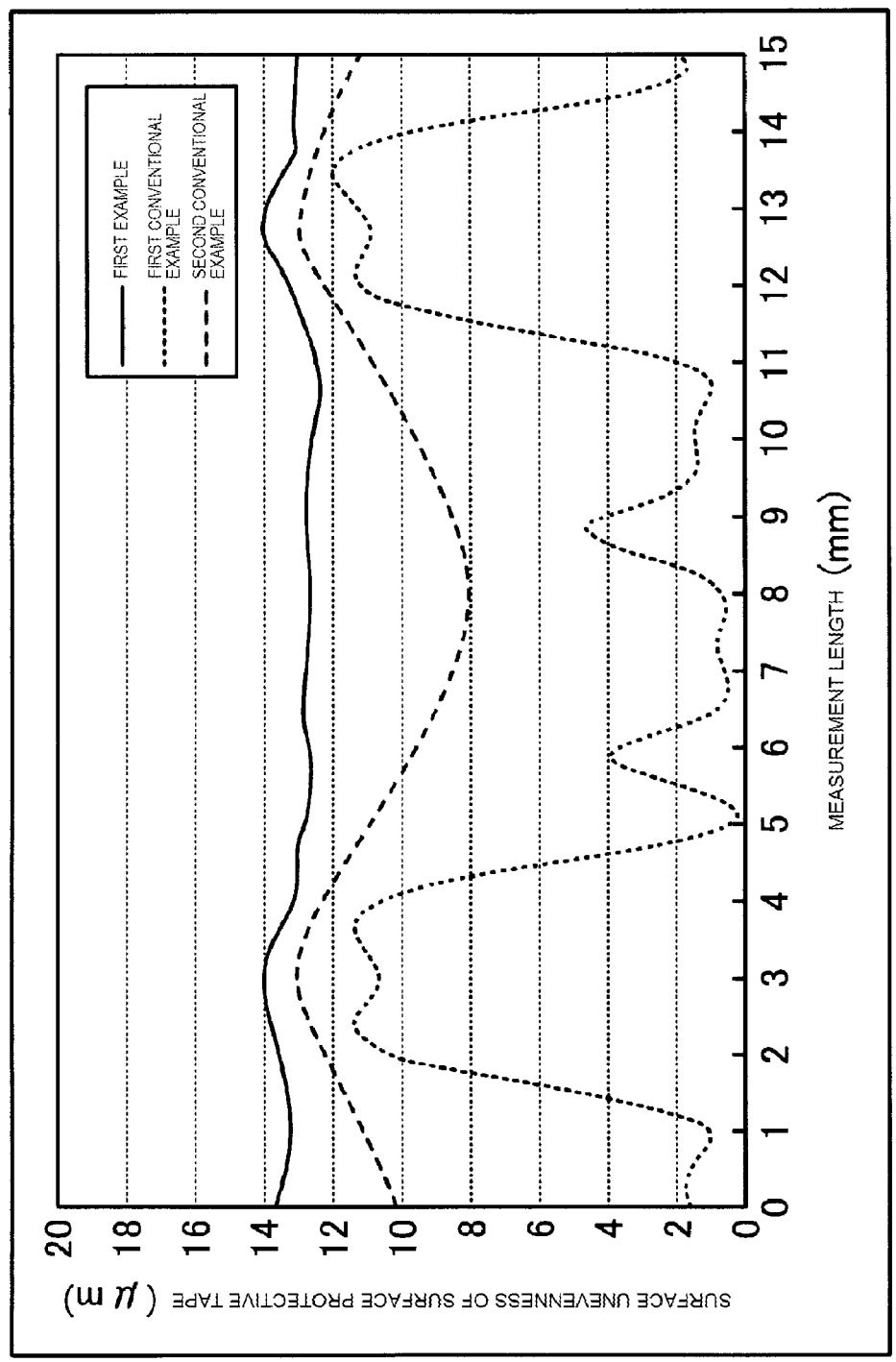
FIG. 15 is a characteristic diagram illustrating the surface unevenness of the surface protective tape immediately before a grinding process in a first example.
Figure 16:
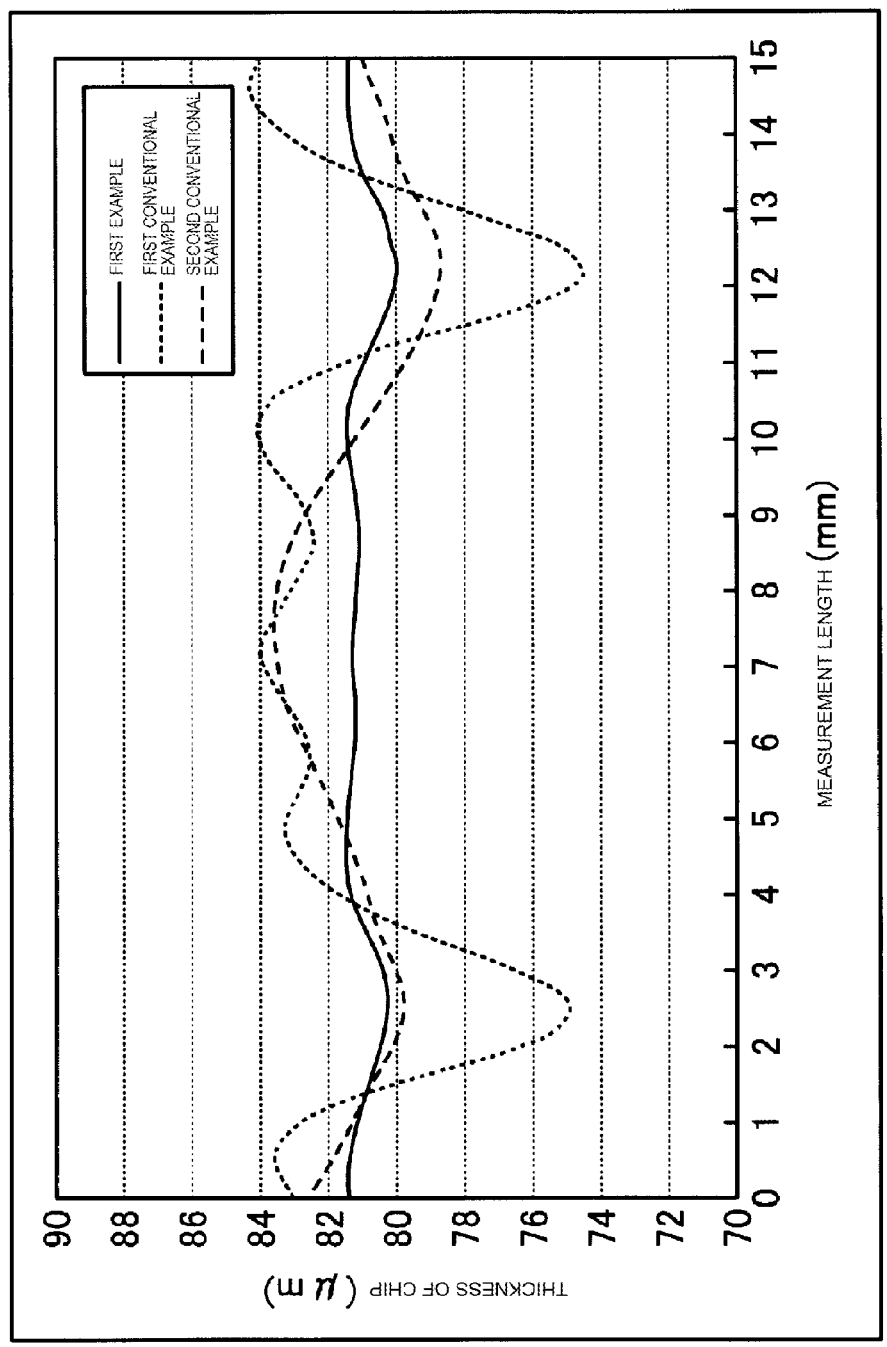
FIG. 16 is a characteristic diagram illustrating the thickness of a wafer after the grinding process in the first example.

The inventors examined the thickness accuracy of the chip when a wafer grinding process was performed using a general surface protective tape with a thickness of 265 μm. The examination result will be described below. FIG. 15 is a characteristic diagram illustrating the surface unevenness of the surface protective tape immediately before a grinding process according to a first example. FIG. 16 is a characteristic diagram illustrating the thickness of the wafer (the thickness of the chip) after the grinding process according to the first example. In FIG. 16, the thickness of the wafer was measured by a transmitted infrared laser (which holds for FIG. 17). A measurement length means the length of a cutting line which traverses the opposite sides of the convex portion formed by the polyimide passivation that surrounds one element forming region in a rectangular shape. Measurement is performed at the same position of the wafer in FIGS. 15 and 16.

In the first example, the surface protective tape 3 attached to the front surface of the wafer 1 is heated while being drawn, based on the semiconductor element producing method according to the embodiment, such that the surface of the surface protective tape 3 is flattened. Then, the rear surface of the wafer 1 is ground. In the surface protective tape 3 with a thickness of 265 μm, the thickness of the adhesive layer (including the intermediate layer) 4 is 215 μm (adhesive layer: 20 μm, intermediate layer: 195 μm) and the thickness of the base layer 5 is 50 μm.

The chip size was 9.7 mm×9.7 mm and the width w12 of the polyimide passivation 52 formed in one element forming region 12 was 600 μm corresponding to the thickness of an IGBT with a breakdown voltage of 1200 V. That is, when the polyimide passivations 52 which are adjacent to each other with the dicing line 51 interposed therebetween in adjacent element forming regions 12 are regarded as one convex portion, the width w10 of the convex portion formed by the polyimide passivations 52 which are adjacent to each other with the dicing line 51 interposed therebetween is 1200 μm.

FIGS. 15 and 16 illustrate the first example and first and second conventional examples for comparison. In the first conventional example, after a surface protective tape is attached to the front surface of a wafer, the rear surface of the wafer is ground. In the second conventional example, after a surface protective tape is attached to the front surface of a wafer, a heating process is performed in a furnace to flatten the surface of the surface protective tape and the rear surface of the wafer. In the first and second conventional examples, conditions are the same as those in the first example except for the steps from the attachment of the surface protective tape to the grinding of the rear surface of the wafer.

The result illustrated in FIG. 15 proved that only the attachment of the surface protective tape to the front surface of the wafer caused the surface protective tape to have a corrugated shape along the convex portion (about a measurement length of 3 mm and 13 mm) formed by the polyimide passivation that had a thickness of about 10 μm and surrounded the element forming region, as in the first conventional example. In the first conventional example, it was confirmed that the surface protective tape had a corrugated shape due to the convex portion (about a measurement length of 6 mm and 9 mm) caused by the insulator passivation which was made of, for example, polyimide, had a thickness of about 10 μm, and protected the gate runner provided in the element forming region. That is, in the first conventional example, it was confirmed that both the performance of reducing the unevenness caused by the polyimide passivation and the performance of reducing the unevenness caused by the insulator passivation which protected the gate runner were low.

It was confirmed that, when the surface protective tape was heated in the furnace as in the second conventional example, the performance of reducing the unevenness caused by the polyimide passivation was higher than that in the first conventional example, but the performance of reducing the unevenness caused by the insulator passivation which protected the gate runner was low, similarly to the first conventional example. In contrast, in the first example, it was confirmed that both the performance of reducing the unevenness caused by the polyimide passivation and the performance of reducing the unevenness caused by the insulator passivation 53 which protected the gate runner were higher than that in the first conventional example and the surface unevenness of the surface protective tape 3 could be minimized to about 2 μm in the surface of the chip.

In the first example and the first and second conventional examples, it was confirmed that the performances of reducing the unevenness of the front surface of the wafer were different from each other, but the performance of reducing the unevenness caused by the insulator passivation which protected the gate runner was higher than the performance of reducing the unevenness caused by the polyimide passivation. The reason is that, since both the polyimide passivation and the insulator passivation which protects the gate runner are formed with a thickness of about 10 μm, the width of the convex portion caused by the insulator passivation which protects the gate runner is less than the width of the convex portion formed by the polyimide passivation. Therefore, it was confirmed that, as the width of the convex portion caused by polyimide passivation on the front surface of the wafer increased, the performance of reducing the surface unevenness of the surface protective tape was reduced.

The result illustrated in FIG. 16 proved that, in the first example and the first and second conventional examples illustrated in FIG. 15, the thickness of a portion of the chip corresponding to the convex portion of the surface of the surface protective tape was small, the thickness of a portion of the chip corresponding to the concave portion of the surface of the surface protective tape was large, and a variation in the thickness of the chip was reduced as the height of the uneven portion of the surface of the surface protective tape was reduced. Therefore, in the first example in which the surface of the surface protective tape was the flattest immediately before the rear surface of the wafer 1 was ground, it was confirmed that a variation in the thickness of the chip 9 after the rear surface of the wafer 1 was ground was the smallest and was suppressed to about 2 μm in the plane of the chip 9.

Figure 17:
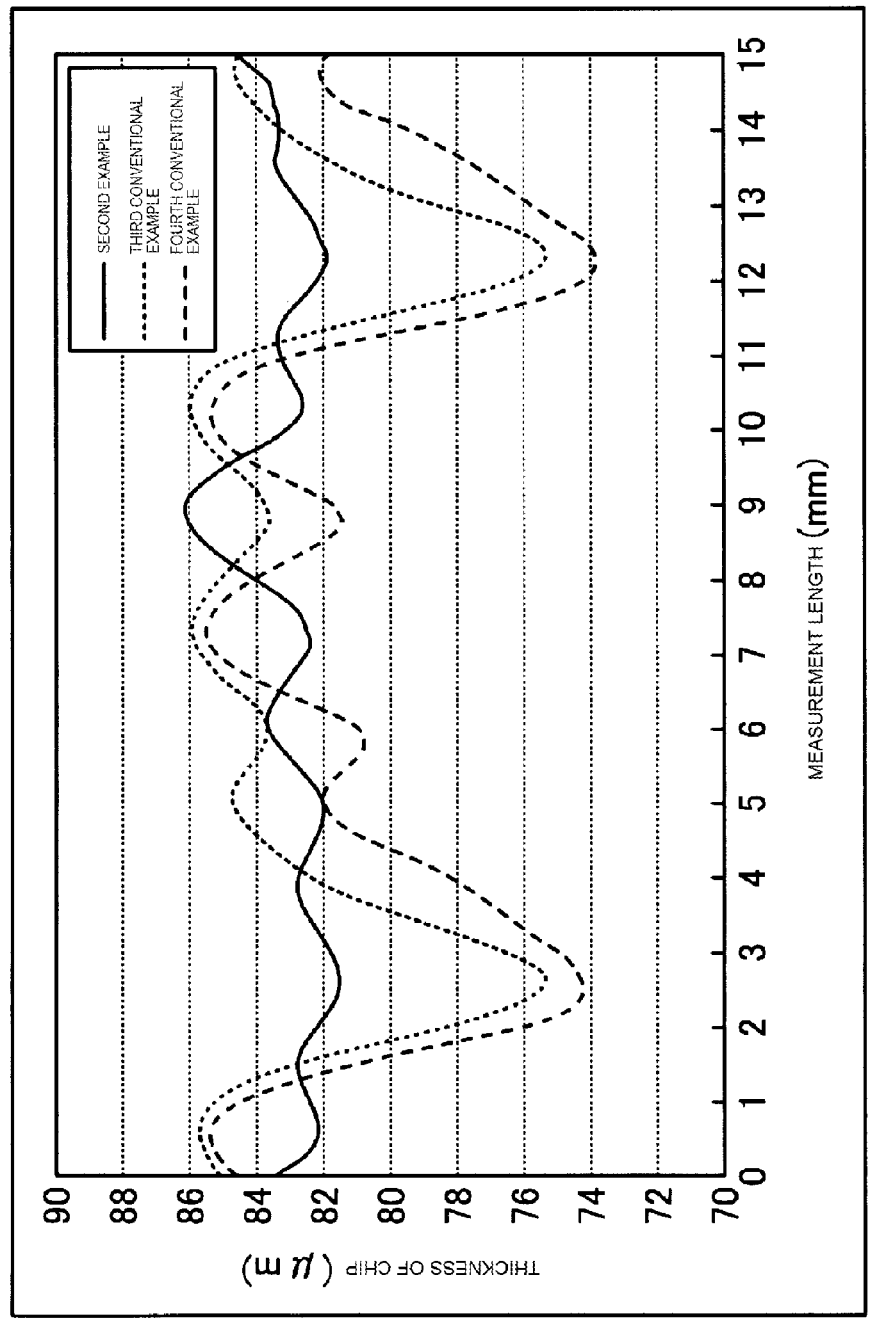
FIG. 17 is a characteristic diagram illustrating the thickness of a wafer after a grinding process in a second example.

The inventors examined the thickness accuracy of the chip when the wafer was ground, using a surface protective tape with a thickness of 165 μm. The examination result will be described. FIG. 17 is a characteristic diagram illustrating the thickness of the wafer (the thickness of the chip) after grinding in a second example. The second example and third and fourth conventional examples illustrated in FIG. 17 are produced by the same method as the first example and the first and second conventional examples except that a thin surface protective tape with a thickness of 165 μm is used. In the surface protective tape with a thickness of 165 μm, the thickness of the adhesive layer (including the intermediate layer) is 140 μm (adhesive layer: 20 μm, intermediate layer: 120 μm) and the thickness of the base layer is 25 μm.

In both the third conventional example in which, since the thickness of the base layer of the surface protective tape was small, no processing was performed after the surface protective tape was attached and the fourth conventional example in which the surface protective tape was heated in the furnace, the surface of the surface protective tape was little flat, and a variation in the thickness of the chip after the rear surface of the wafer was ground as illustrated in FIG. 17 was not reduced. In contrast, in the second example, it was confirmed that a variation in the thickness of the chip 9 after the rear surface of the wafer 1 was ground was reduced, but was less than that in the first example using the surface protective tape 3 with a thickness of 265 μm.

Figure 18:
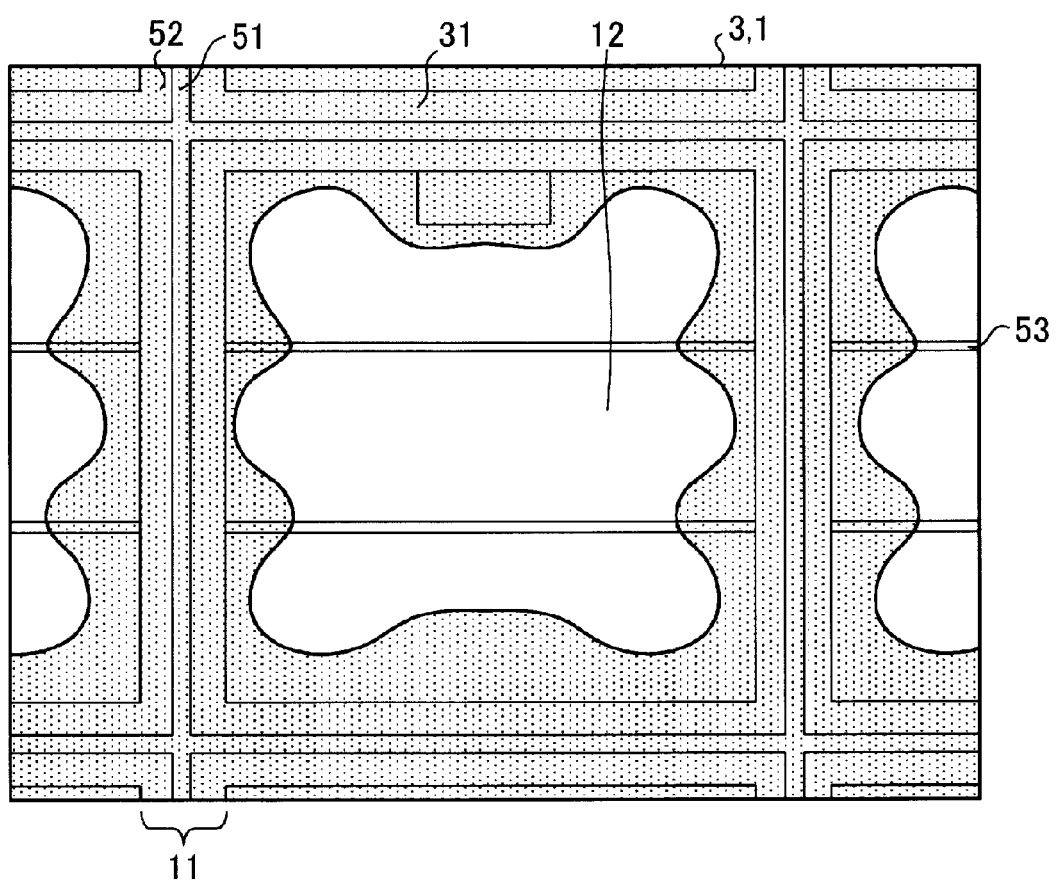
FIG. 18 is a conceptual diagram schematically illustrating the state of air bubbles in the front surface of the wafer before a heating process in the first example.
Figure 19:
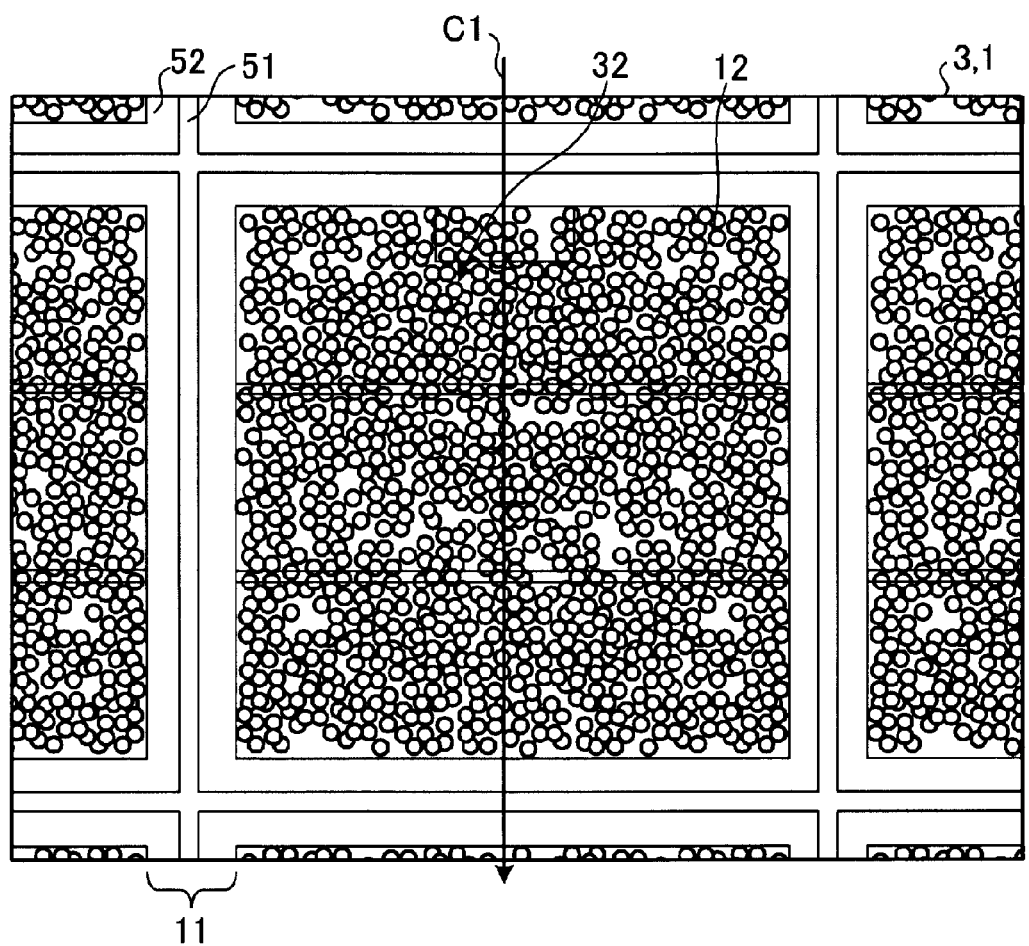
FIG. 19 is a conceptual diagram schematically illustrating the state of air bubbles in the front surface of the wafer after a drawing and heating process in the first example.
Figure 20:
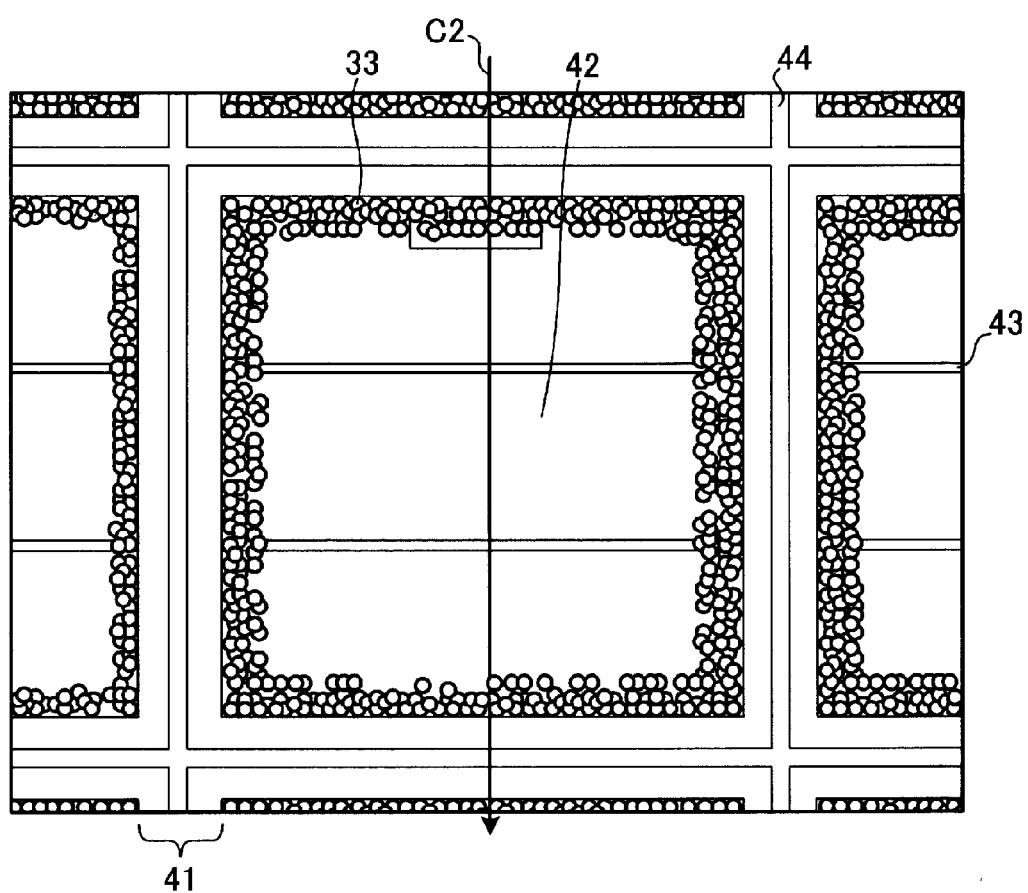
FIG. 20 is a conceptual diagram schematically illustrating the state of air bubbles in the front surface of the wafer before a heating process in a second conventional example.
Figure 21:
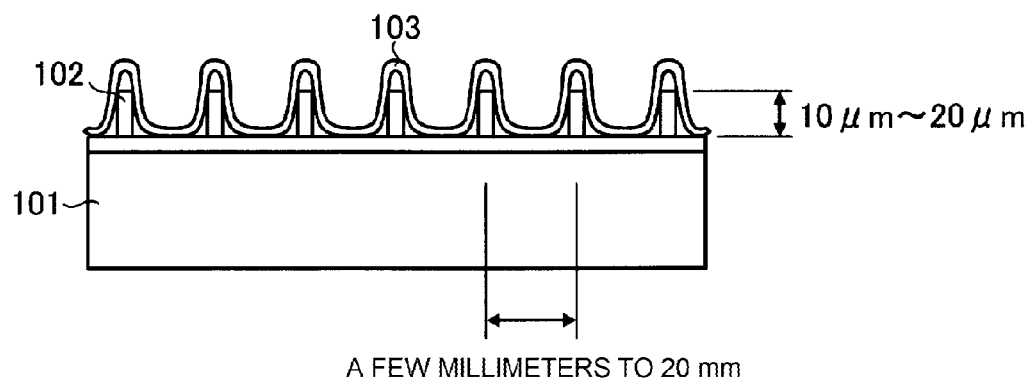
FIG. 21 is a cross-sectional view schematically illustrating the attached state of a surface protective tape according to the related art to the front surface of a wafer.
Figure 22:
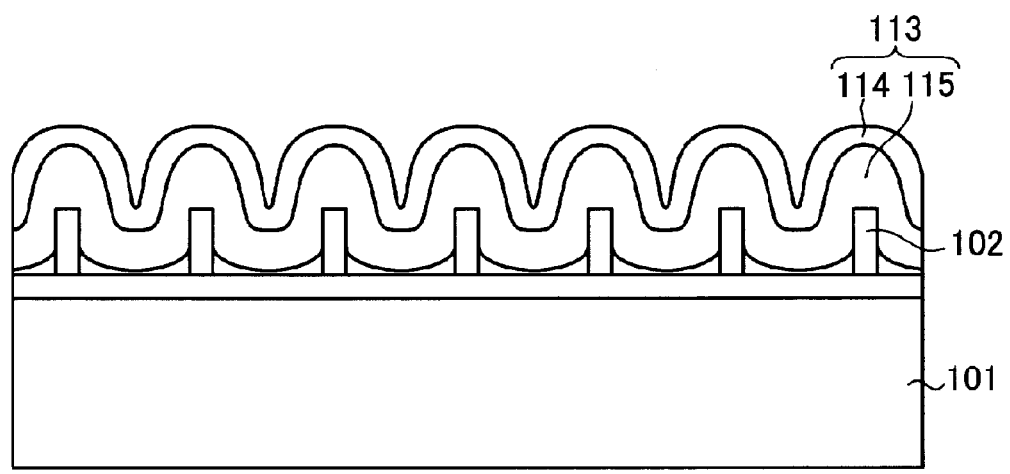
FIG. 22 is a cross-sectional view schematically illustrating another example of the attached state of the surface protective tape according to the related art to the front surface of the wafer.
Figure 23:
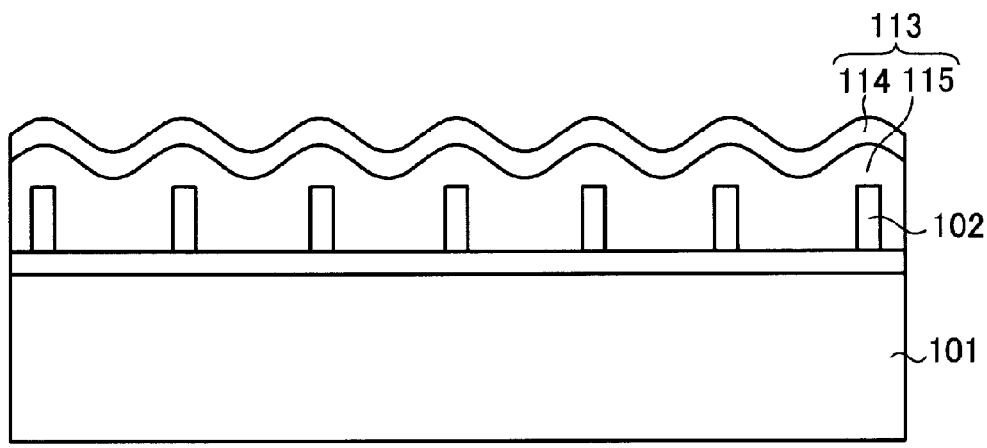
FIG. 23 is a cross-sectional view schematically illustrating another example of the attached state of the surface protective tape according to the related art to the front surface of the wafer.
Figure 24:
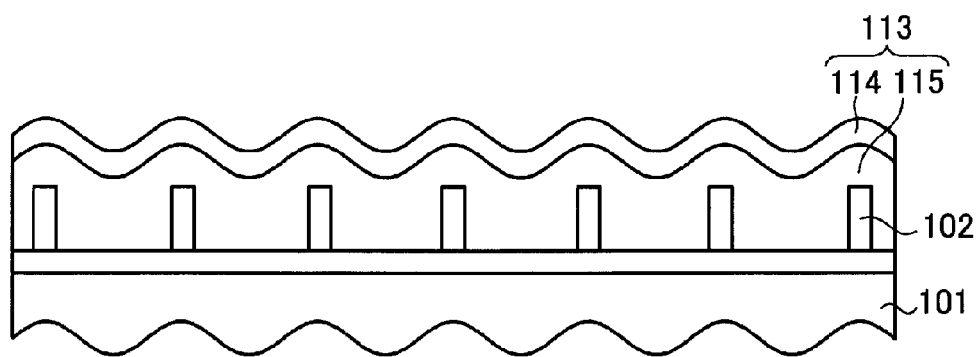
FIG. 24 is a cross-sectional view schematically illustrating another example of the attached state of the surface protective tape according to the related art to the front surface of the wafer.

The inventors observed the air bubbles which were generated between the adhesive layer of the surface protective tape and the uneven portion of the front surface of the wafer in the first example and the second conventional example. The observation result will be described. FIG. 18 is a conceptual diagram schematically illustrating the state of the air bubbles in the front surface of the wafer before the heating process in the first example. FIG. 19 is a conceptual diagram schematically illustrating the state of the air bubbles in the front surface of the wafer after the drawing and heating process in the first example. FIG. 20 is a conceptual diagram schematically illustrating the state of the air bubbles in the front surface of the wafer after the heating process in the second conventional example. In FIGS. 19 and 20, arrows C1 and C2 which cut the wafer are measurement lines when the unevenness of the surface protective tape illustrated in FIG. 15 is measured in the first example and the second conventional example.

As illustrated in FIG. 18, a large number of air bubbles (hatched portion) 31 remain in the vicinity of the convex portion caused by the polyimide passivation 11 between the surface protective tape 3 attached to the front surface of the wafer 1 and the front surface of the wafer 1 before heating. It was confirmed that, when the surface protective tape 3 attached to the front surface of the wafer 1 was heated while being drawn, the air bubble 31 which remained between the adhesive layer 4 of the surface protective tape 3 and the front surface of the wafer 1 before heating was broken into a plurality of small air bubbles 32 and the small air bubbles were uniformly dispersed in the plane of the element forming region 12, as illustrated in FIG. 19.

It was confirmed that the small air bubbles 32 absorbed a level difference generated by the unevenness caused by the polyimide passivation 11 (polyimide passivation 52) and the insulator passivation 53 which protected the gate runner and the surface unevenness of the surface protective tape 3 was reduced. In the semiconductor element in which the gate runner was formed on the front surface of the wafer 1, it was confirmed that the level difference caused by the insulator passivation 53 which was made of, for example, polyimide and was formed on the gate runner was reduced and the surface unevenness of the surface protective tape 3 was reduced.

In contrast, in the second conventional example, the state of the air bubbles in the front surface of the wafer before the heating process was the same as that in the first example (the air bubble 31 illustrated in FIG. 18) and the air bubble was broken into small air bubbles after the heating process in the furnace, similarly to the first example. As illustrated in FIG. 20, in the second conventional example, it was confirmed that the small air bubbles 33 which were generated after the heating process were dispersed in the vicinity of a polyimide passivation 41 and the surface unevenness of the surface protective tape in the vicinity of a convex portion caused by the polyimide passivation 41 was reduced. However, in the second conventional example, it was confirmed that, since the small air bubbles 33 which were generated after the heating process were not dispersed in the plane of an element forming region 42, the surface unevenness of the surface protective tape in the plane of the element forming region 42 was not reduced. In FIG. 20, reference numerals 43 and 44 indicate a gate runner and a dicing line, respectively.

As illustrated in FIG. 18, when air bubbles are concentrated on one spot or a few spots and a large air bubble 31 is generated, the mechanical strength of the wafer 1 is reduced. Therefore, it is preferable to prevent air bubbles from being concentrated on one spot or a few spots. That is, the large air bubble 31 illustrated in FIG. 18 is preferably broken into a plurality of small air bubbles 32 and 33, as illustrated in FIGS. 19 and 20, and the small air bubbles 32 and 33 is preferably uniformly dispersed in the lane of the element forming region 12. When the air bubble is broken into small air bubbles, the intermediate layer which is arranged around the air bubbles can cover (reduce) a reduction in the mechanical strength of the wafer 1 due to the air bubbles. Therefore, a reduction in the mechanical strength of the wafer 1 is suppressed.

As described above, since the intermediate layer of the adhesive layer 4 has fluidity and a plurality of small air bubbles 32 are generated in the intermediate layer, the surface protective tape 3 is flattened. It is preferable that the thickness of the intermediate layer of the adhesive layer 4 be equal to or greater than 100 μm, in order to effectively flatten the surface protective tape 3. However, when the thickness of the intermediate layer is greater than 300 μm, waste is generated when the wafer 1 is cut, which is not preferable. Therefore, it is more preferable that the thickness of the intermediate layer of the adhesive layer 4 be equal to or greater than 100 μm and equal to or less than 300 μm. When the thickness of the intermediate layer is equal to or greater than 100 μm and equal to or less than 300 μm, it is possible to prevent the generation of waste when the wafer 1 is cut and to effectively flatten the surface protective tape 3.

As described above, according to the embodiment, the surface protective tape attached to the front surface of the wafer is heated while being drawn. Therefore, extra air which remains between the adhesive layer of the surface protective tape and the front surface of the wafer when the surface protective tape is attached to the front surface of the wafer is broken into small air bubbles and the small air bubbles are generated in the concave portion of the front surface of the wafer. The adhesive layer is deformed by the air bubbles and fills the concave portion of the front surface of the wafer. Therefore, even when the gap between the element forming regions or the gap between the convex portions caused by the polyimide passivation or the insulator passivation in the plane of the element forming region increases, unevenness caused by the polyimide passivation on the front surface of the wafer is reduced and it is possible to flatten the surface of the surface protective tape, as compared to the related art. Thus, it is possible to reduce a variation in the thickness of the wafer after the rear surface of the wafer is ground. As a result, it is possible to improve the thickness accuracy of the chip, to produce a semiconductor element with a minimum chip thickness required to obtain a desired breakdown voltage, and thus to reduce electrical loss caused by a variation in the thickness of the chip.

According to the embodiment, since the surface protective tape attached to the front surface of the wafer is heated while being drawn, it is possible to improve the thickness accuracy of the chip even when a thin surface protective tape (a surface protective tape including a thin intermediate layer) is used. Therefore, it is possible to reduce the cost of the surface protective tape.

The invention is not limited to the above-described embodiment, but various modifications and changes of the invention can be made. For example, a punch-through (PT), non-punch-through (NPT), or field-stop (FS) IGBT or a diode, such as a free wheeling diode (FWD) can be produced by the production process according to the invention. In addition, the surface element structure portion of the IGBT may be a planar type or a trench type.

In the above-described embodiment, after the wafer is ground, the surface protective tape is detached and the subsequent step is performed. However, when the surface protective tape has high acid resistance or a very small amount of impurities, such as carbon, is generated in high vacuum, the step after the wafer grinding process may be performed, without detaching the surface protective tape. In addition, in the above-described embodiment, the wafer 1 is placed on the stage 21 which is heated by the heater. However, the positional relationship between the wafer 1 and the stage 21 may be reversed and the stage 21 may be disposed on the wafer 1. In this case, the surface protective tape 3 attached to the front surface of the wafer is heated while being drawn from the upper side of the wafer 1. In this way, waste is not deposited on the stage 21 and it is possible to prevent a reduction in yield due to waste. The invention is not limited to the IGBT in which the thickness of the wafer after grinding (including the thickness of the surface element structure portion) is 100 μm, but can be applied to, for example, a power semiconductor element producing method including a step of grinding the rear surface of the wafer to reduce the thickness of the wafer to 100 μm or less.

INDUSTRIAL APPLICABILITY

As described above, the semiconductor element producing method according to the invention is useful to produce a thin semiconductor element and is particularly suitable to produce a power semiconductor element such as an IGBT which is used in the industrial field including, for example, a general-purpose inverter, an AC servomechanism, an uninterruptible power source (UPS), or a switching power supply or the consumer equipment field including a microwave oven, a rice cooker, or a strobe.

It will be apparent to those skilled in the art that various modifications and variations can be made to the disclosed method. Other embodiments will be apparent to those skilled in the art from consideration of the specification and practice of the disclosed method. It is intended that the specification and examples be considered as exemplary only, with a true scope being indicated by the following claims.

The invention claimed is:

1. A semiconductor element producing method comprising:
    attaching a tape including a base layer and an adhesive layer, contacting the base layer, to a front surface of a semiconductor wafer that has an uneven portion such that the adhesive layer adheres to the front surface of the semiconductor wafer, with an air bubble remaining between the adhesive layer and the front surface of the semiconductor wafer, such that the tape has a corrugated shape in which the base layer of the tape includes peak-shaped portions over raised portions of the semiconductor wafer and trough-shaped portions between the peak-shaped portions and between the raised portions of the semiconductor wafer; and
    heating the tape having the corrugated shape while drawing the tape in a direction in which the tape is separated from the front surface of the semiconductor wafer, the air bubble breaking into a plurality of small air bubbles and the plurality of small air bubbles dispersing in the adhesive layer, and a surface of the corrugated base layer being flattened such that a height difference between the peak-shaped portions and the trough-shaped portions is reduced.

2. The semiconductor element producing method according to claim 1, wherein:
    a lattice-shaped convex portion is provided on the front surface of the semiconductor wafer along an outer periphery of each chip, configured to be divided from the semiconductor wafer, such that an element forming region of each chip is a concave portion; and during drawing and heating of the tape, the adhesive layer is deformed so as to absorb a level difference between the lattice-shaped convex portion and the concave portion of the element forming region.

3. The semiconductor element producing method according to claim 1, further comprising grinding a rear surface of the semiconductor wafer, with the tape attached to the semiconductor wafer, and thinning the semiconductor wafer, after drawing and heating the tape.

4. The semiconductor element producing method according to claim 1, wherein the thickness of an intermediate layer of the adhesive layer is equal to or greater than 100 µm and equal to or less than 300 µm.

5. The semiconductor element producing method according to claim 1, wherein, during drawing and heating of the tape, the semiconductor wafer is placed on a stage that heats the tape while drawing the tape.

\* \* \* \* \*